US010326447B1

(12) United States Patent
Kim et al.

(10) Patent No.: US 10,326,447 B1
(45) Date of Patent: Jun. 18, 2019

(54) LATCH CIRCUIT PREVENTING OUTPUT FAILURE DUE TO SIMULTANEOUS TRANSITION OF CONTROL SIGNAL AND INPUT SIGNAL

(71) Applicant: ADTechnology Co., Ltd., Seongnam-si, Gyeonggi-do (KR)

(72) Inventors: Young Seung Kim, Seoul (KR); Scott Seungmoon Yoo, Seongnam-si (KR); Min Chul Jung, Seoul (KR); Jun Suk Kim, Seoul (KR)

(73) Assignee: ADTECHNOLOGY CO., LTD., Seongnam-si (KR)

( * ) Notice: Subject to any disclaimer, the term of this patent is extended or adjusted under 35 U.S.C. 154(b) by 0 days.

(21) Appl. No.: 16/012,227

(22) Filed: Jun. 19, 2018

(30) Foreign Application Priority Data

Mar. 7, 2018 (KR) ........................ 10-2018-0027028

(51) Int. Cl.
| | |
|---|---|
| *H03K 3/02* | (2006.01) |
| *H03K 19/003* | (2006.01) |
| *H03K 3/037* | (2006.01) |
| *H03K 19/20* | (2006.01) |
| *H03K 5/00* | (2006.01) |

(52) U.S. Cl.
CPC .......... *H03K 19/003* (2013.01); *H03K 3/037* (2013.01); *H03K 5/00* (2013.01); *H03K 19/20* (2013.01); *H03K 2005/00078* (2013.01)

(58) Field of Classification Search
None
See application file for complete search history.

(56) References Cited

U.S. PATENT DOCUMENTS

| | | | | |
|---|---|---|---|---|
| 7,764,099 B2* | 7/2010 | Sugimoto | ............. | H03L 7/0812 327/198 |
| 2008/0025457 A1* | 1/2008 | Pyeon | ............. | H03K 21/38 377/118 |

* cited by examiner

*Primary Examiner* — Long Nguyen
(74) *Attorney, Agent, or Firm* — Stein IP, LLC

(57) ABSTRACT

Disclosed herein is a latch circuit capable of preventing an output failure caused due to simultaneous transition of a control signal and an input signal. The latch circuit according to the present invention generates a separate control adjustment signal CTR using the control signal Control and the input signal In and uses the control adjustment signal CTR, instead of the control signal for a latch operation. Accordingly, when the control signal and the input signal transition at the same time, the control adjustment signal is processed not to transition during a transition interval of the input signal, thereby preventing a metastability problem that occurred in the existing latch circuit.

6 Claims, 5 Drawing Sheets

PRIOR ART

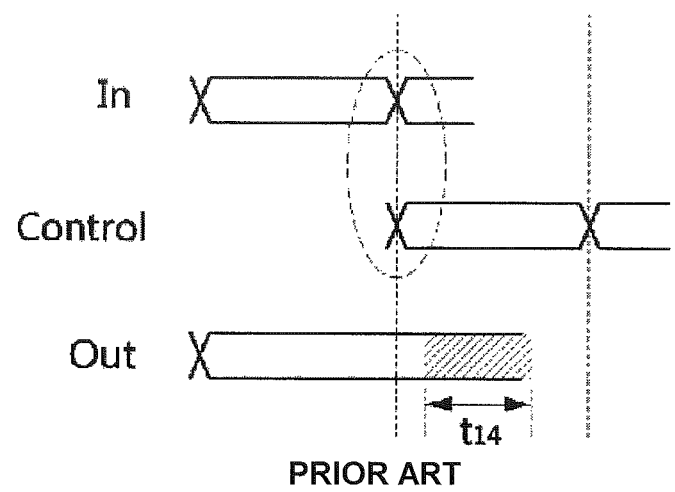

LATCH CIRCUIT PREVENTING OUTPUT FAILURE DUE TO SIMULTANEOUS TRANSITION OF CONTROL SIGNAL AND INPUT SIGNAL

CROSS REFERENCE TO RELATED APPLICATION

The present application claims priority to Korean Patent Application No. 10-2018-0027028, filed Mar. 7, 2018, the entire contents of which is incorporated herein for all purposes by this reference.

BACKGROUND OF THE INVENTION

Field of the Invention

The present invention relates to a latch circuit that receives a control signal and an input signal and latches the input signal and, more particularly, to a latch circuit that processes a control signal in such a manner to be changed into a specific form to create a safety interval in which a transition of the control signal is not caused during a transition of an input signal, thereby preventing a metastability problem.

Description of the Related Art

In digital logic circuits, digital signals must have voltage and/or current conditions that can represent zero and one. If the signal is in a transient state, an unstable state can take place in which the output cannot be predicted, and the circuit can perform a behavior that is not predicted by the designer. Such a metastability problem can also take place in a latch circuit.

Here, the latch circuit holds an input signal in a specific form according to a control signal and outputs the resulting signal, like a normal SR latch. The latch circuit includes a NAND gate type latch based on NAND gate, a NOR gate type latch based on NOR gate, and a pass gate latch that can be used either in a NAND type or a NOR type.

When the control signal and the input signal are logically opposite to each other, the latch circuit inverts the input signal and outputs the inverted input signal. An output of the NAND gate type latch remains unchanged when both the control signal and the input signal are a logical high (High, 1), and an output of the NOR gate latch remains unchanged when both the control signal and the input signal are a logical low (Low, 0).

FIG. 1 is a diagram depicting an operation of a conventional latch circuit, to which the present invention can be applied.

The NAND gate type latch operates to latch an original output even though the input signal changes while the control signal Control maintains a logical high state. First, before the control signal Control becomes a logical high state at a point of time t11, the latch circuit simply inverts the input signal In to output the signal of a logical high state. Even though the control signal Control transitions to a logical high state at a time t11 and then the input signal In is changed to the logical high state at a point of time t12, the output Out of the latch circuit is not changed to maintain a logical high state. This state continues until the control signal Control transitions to a logical low state at a point of time t13 (Hold interval). When the control signal Control becomes the logical low state, the latch circuit inverts the input signal In to perform the latch operation. Table 1 below shows the operation of the NAND gate type latch.

TABLE 1

| Input signal | Control signal | Output |
|---|---|---|
| 1 | 0 | 0 |
| 0 | 0 | 1 |
| 0 | 1 | 1 |
| 1 | 1 | 1 |
| 1 | 0 | 0 |

The NOR type latch has an opposite state to that of the NAND type latch. The NOR type latch inverts an input signal In to output the signal of a logical low until the control signal Control becomes a logical low state at a point of time t11. After the control signal Control becomes a logical low state at a point of time t11, an output of the latch circuit maintains the logical low state even though the input signal In is changed at a point of time t12. The logical low output continues until the control signal Control becomes a logical high again at a point of time t13 (Hold interval). When the control signal Control becomes the logical high state at the point of time t13, the NOR type latch inverts the input signal to perform the latch operation. Table 2 below shows the operation of the NOR type latch.

TABLE 2

| Input signal | Control signal | Output |
|---|---|---|
| 0 | 1 | 1 |
| 1 | 1 | 0 |
| 1 | 0 | 0 |
| 0 | 0 | 0 |
| 0 | 1 | 1 |

The pass gate type may operate as a NAND type latch or a NOR type latch according to control of a control signal Control.

In order for the latch circuit to perform the above-described latch operation without a failure, logic value of at least one of the input signal In or the control signal Control must be clear. For example, a specific interval must exist between the point of time t11 at which the state of the control signal Control has transitioned in FIG. 1 and the point of time t12 at which the input signal In has transitioned, which is referred to as a setup interval. The fact that the setup interval is more than a specific size means that the control signal Control and the input signal In are not simultaneously in an unstable transition state.

However, a problem may occur as shown in FIGS. 2A and 2B. FIGS. 2A and 2B are a diagram depicting a metastability problem caused in a conventional latch circuit, in which the metastability problem is likely to occur in a conventional latch circuit.

However, when the control signal Control and the input signal In transition at the same time so that the points of time t11 and t12 overlap with each other, the latch circuit processes an unstable state and the output Out becomes unstable, whereby a failure occurs.

As shown in FIGS. 2A and 2B, when the control signal Control and the input signal In transition almost at the same time so that the setup interval is almost not created, both the control signal Control and the input signal In have an unclear logic value and enter an unstable state in which the state of the output Out becomes unclear for a preset time t14. Thus, a problem concerning so-called metastability may occur. In a case of the NAND type latch, the problem occurs when the input signal In transitions at a point of time when the control signal Control transitions from the logical low to the logical high. In contrast, in a case of the NOR type latch, the problem occurs when the input signal In transitions at a point of time when the control signal Control transitions from the logical high to the logical low.

When the setup interval is secured, there is no longer an interval in which the logic values of the input signal In and the control signal Control are unclear, so that the output becomes clear and the metastability problem does not occur. However, the problem can occur at any time when the control signal Control and the input signal In transition at the same time.

SUMMARY OF THE INVENTION

Accordingly, the present invention has been made keeping in mind the above problems occurring in the prior art, and an object of the present invention is to provide a latch circuit that processes a control signal in such a manner to be changed into a specific form to create a safety interval in which a transition of the control signal is not caused during a transition of an input signal, thereby preventing a metastability problem.

In order to achieve the object, the present invention provides a latch circuit receiving an input signal In and a control signal Control and latching the input signal In in a specific form, the latch circuit including a latch block and a control unit.

The latch block includes a first terminal and a second terminal for receiving the input signal In, and is configured to latch the input signal in a specific form during a latch interval following a setup interval according to a change in logic values of the signals input to the first terminal and the second terminal.

The control unit receives the input signal In and the control signal Control, and outputs a control adjustment signal obtained by adjusting the control signal to the first terminal. Herein, when the control signal Control and the input signal In transition at the same time without a setup interval, the control adjustment signal has a logic value of the latch interval during the transition interval of the input signal In, thereby preventing an output error of the latch block that occurs in a case that the control signal and the input signal transition at the same time.

Meanwhile, the latch block of the present invention may include a NAND gate type, a NOR gate type, or a pass gate type.

Embodiment

When the latch block is a NAND gate type, the control adjustment signal is obtained by delaying the input signal In by a preset time and then inverting the delayed input signal In when the control signal Control is in a logical low state.

For example, when the latch block is a NAND gate type, the control unit includes a delay unit delaying the input signal by the preset time to output the delayed signal, a first inverter inverting an output of the delay unit, a NOR gate NOR-ing an output of the first inverter and the control signal, and a second inverter inverting an output of the NOR gate to output the control adjustment signal.

As another example, when the latch block is a NAND gate type, the control unit includes a delay unit delaying the input signal by the time to output the delayed signal, and a third inverter inverting the control signal, and a NAND gate NAND-ing an output of the third inverter and an output of the delay unit.

Embodiment

When the latch block is a NOR gate type, the control adjustment signal is obtained by delaying the input signal In by a preset time and then inverting the delayed input signal when the control signal Control is in a logical high state.

For example, when the latch block is a NOR gate type, the control unit includes a delay unit delaying the input signal by the preset time to output the delayed signal, a first inverter inverting the output of the delay unit, a NAND gate NAND-ing an output of the first inverter and the control signal, and a second inverter inverting an output of the NAND gate to output the control adjustment signal.

As another example, when the latch block is a NOR gate type, the control unit includes a delay unit delaying the input signal by the preset time to output the delayed signal, a third inverter inverting the control signal, and a NOR gate NOR-ing an output of the third inverter and an output of the delay unit.

The latch circuit of the present invention includes a separate logic circuit for processing the control signal, so that, even though the control signal and the input signal transition at the same time, the control signal finally input to the latch block is processed not to transition at the same time as the input signal, thereby preventing the metastability problem.

The present invention is characterized in that a designer not only can use the existing NAND gate type latch, NOR gate type latch, or pass gate type latch as they are, but also eliminate a need to change the input signal and the control signal.

BRIEF DESCRIPTION OF THE DRAWINGS

The above and other objects, features and other advantages of the present invention will be more clearly understood from the following detailed description when taken in conjunction with the accompanying drawings, in which:

FIGS. 2A and 2B are a diagram depicting an operation (error state) of a conventional latch circuit;

DETAILED DESCRIPTION OF THE INVENTION

Figure 1:
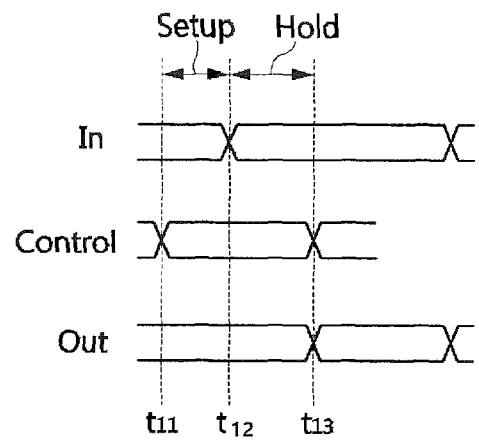
FIG. 1 is a diagram depicting an operation of the existing latch circuit.
Figure 2A:
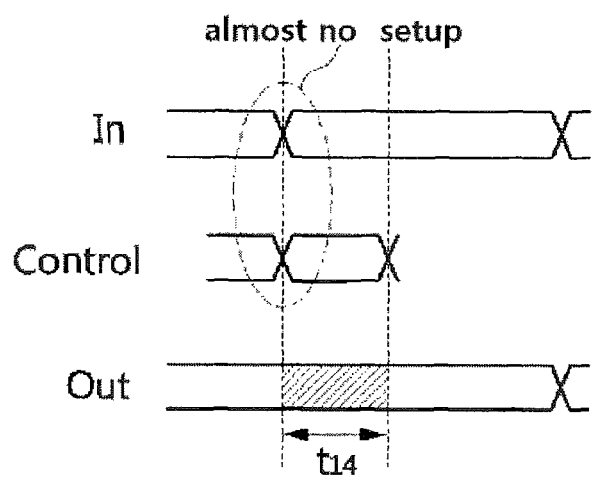
Figure 3:
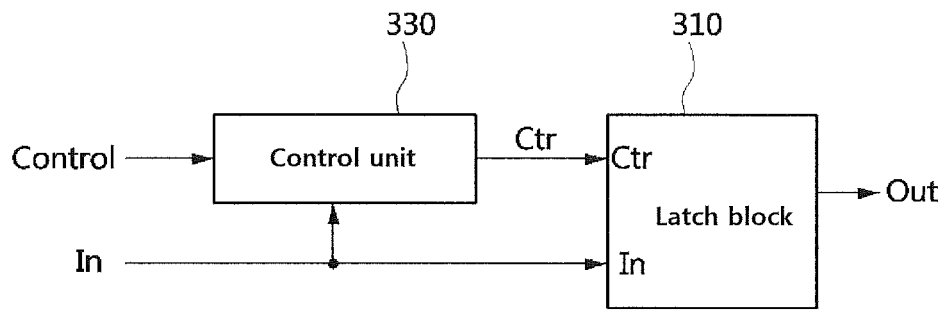
FIG. 3 is a view illustrating a latch circuit according to the present invention.

Referring to FIG. 3, the latch circuit 300 according to the present invention includes a latch block 310 and a control unit 330, and is configured to receive a control signal Control and an input signal In to perform a latch operation. The control unit 330 receives the control signal Control and the input signal In and outputs a control adjustment signal Ctr to the latch block 310, and the latch block 310 receives the control adjustment signal Ctr and the input signal In to perform a normal latch operation.

First, the latch block 310 has a first terminal and a second terminal for receiving a control signal Control and an input signal In, respectively, and a third terminal for output, and can be a NAND gate type latch block, a NOR gate type latch block, or a pass gate type latch block described in the above background. The latch circuit according to present invention receives the input signal In through the second terminal like the existing latch circuit, and is different from the existing latch circuit in that the control adjustment signal Ctr is input through the first terminal, instead of the control signal Control.

Particularly, the present invention is applied to a situation in which the latch circuit is used for the purpose of obtaining a specific form of output at a specific point of time using the control signal Control, regardless of a point of time t12 at which the input signal In transitions. Accordingly, the latch block 310 latches the input signal In in a specific form after a hold interval following a setup interval according to a change in logic value of a signal input to the first terminal and the second terminal.

Summarizing the related operations, when the control adjustment signal Ctr and the input signal are logically opposite to each other, the latch block 310 inverts the input signal In and outputs the inverted signal. An output of the NAND latch block is kept unchanged when the control adjustment signal Ctr and the input signal In are both in a logical high state (High, 1), and an output of the NOR gate latch block is kept unchanged when the control adjustment signal Ctr and the input signal In are both in a logical low state (Low, 0).

The NAND latch block maintains the original output even though the input signal In changes while the state of the control adjustment signal maintains a logical high state. The NAND type latch block simply inverts the input signal In to output the inverted signal before the control adjustment signal Ctr transitions to a logical high state. When the control adjustment signal Ctr transitions to a logical high state, an output Out of the NAND type latch block is not changed even though the input signal In is changed to a logical high state after a specific setup interval and maintains a logical high state until the control adjustment signal Ctr transitions to a logical low state. When the control adjustment signal Ctr transitions to a logical low state, the NAND type latch block inverts the input signal In and outputs the signal of a logical low state. The status table in Table 1 is also applied to the NAND type latch block by changing the control signal Control into the control adjustment signal Ctr.

The control adjustment signal in the NOR type latch block has the state opposite to that of the control adjustment signal in the NAND latch block. First, until the control adjustment signal Ctr transitions to a logical low state, the NOR type latch block inverts the input signal In to output the signal of a logical low state. After the control adjustment signal Ctr transitions to a logical low state, the output of the NOR type latch block maintains a logical low state even though the input signal In is changed after a specific setup interval. When the control adjustment signal Ctr of a logical low state becomes a logical high state again, the NOR type latch block inverts the input signal In to output the inverted signal. The status table in Table 2 is also applied to the NOR type latch block by changing the control signal Control into the control adjustment signal Ctr.

The pass gate type may operate as a NAND type latch or a NOR type latch according to control of the control adjustment signal Ctr.

The control unit 330 receives the control signal Control and the input signal In and outputs a control adjustment signal to the first terminal of the latch block 310, instead of the control signal Control. The control unit 330 controls such that the control adjustment signal Ctr input to the latch block 310 does not transition at the same time as the input signal IN even when the control signal Control transitions at the same time as the input signal In so that a situation in which there is no setup interval takes place.

Since the logical value of the control signal in the setup interval and the hold interval is different from the NAND type latch block to the NOR gate type latch block, the control unit 330 must have a different structure for each of the NAND type latch block and the NOR type latch block and the control adjustment signal output from the control unit 330 must be also different. The control unit 330 for the NAND type latch block outputs a first control adjustment signal Ctr by OR-ing a signal obtained by delaying the input signal In and then inverting the delayed signal and the control signal Control. The control unit 330 for the NOR type latch block outputs a second control adjustment signal Ctr by AND-ing a signal obtained by delaying the input signal In and then inverting the delayed signal and the control signal Control.

Figure 4A:
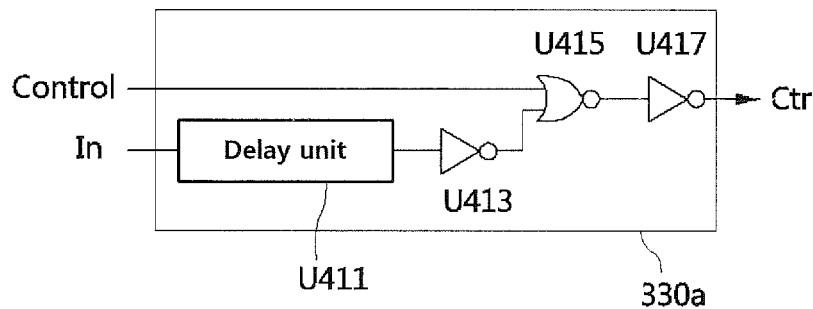
FIGS. 4A and 4B are a view illustrating an embodiment of a control unit (for a NAND type latch block) shown in FIG. 3.
Figure 4B:
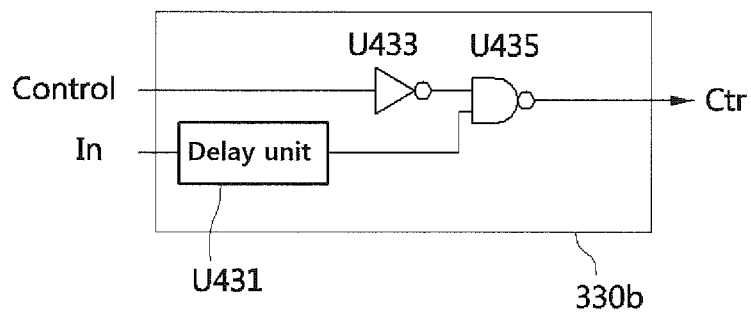

FIGS. 4A and 4B show examples of the control units 330a and 330b for the NAND type latch block. Referring to in FIG. 4A, the control unit 330a for the NAND type latch block includes a delay unit U411 for delaying the input signal In by a preset time and outputting the delayed signal, a first inverter U413 for inverting an output of the delay unit U411 and outputting the inverted signal, a NOR gate U415 for NOR-ing an output of the first inverter U413 and the control signal Control, and a second inverter U417 for inverting an output of the NOR gate U415 and outputting a first control adjustment signal Ctr.

FIG. 4B is based on a NAND gate, and has the same logical expression as in FIG. 4A. Accordingly, the output of FIG. 4B is the same as that of the circuit in FIG. 4A. Referring to FIG. 4B, the control unit 330b for the NAND type latch block includes a delay unit U431 for delaying the input signal In by a preset time and outputting the delayed signal, a third inverter U433 for inverting an output of the control signal Control and outputting the inverted signal, and a NAND gate U435 for NAND-ing an output of the third inverter U433 and an output of the delay unit U431 and outputting a second control adjustment signal Ctr.

Figure 5:
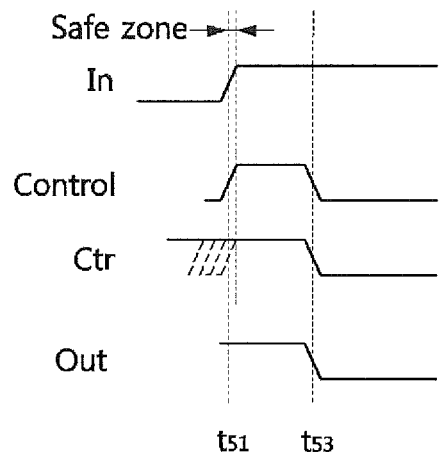
FIG. 5 is a diagram depicting an operation of a latch circuit to which the control unit of FIGS. 4A and 4B is applied.

FIG. 5 shows an operation of the latch circuit 300 to which the control units 330a and 330b of FIG. 4A or 4B are applied. As described above, since the output of the circuit of FIG. 4A is the same as that of the circuit of FIG. 4B, it will be described hereinafter on a basis of the latch circuit 300 to which the control unit 330a shown in FIG. 4A is applied.

Referring to FIG. 5, as the control signal Control and the input signal In transition to a logical high state at the same time, there is almost no setup interval. The first inverter U413 of the control unit 330a inverts the input signal In that is delayed in the delay unit U411 and outputs the inverted input signal to the NOR gate U415. The NOR gate U415 and the second inverter U417 perform a logic OR operation on the control signal Control and the output of the first inverter U413 and output the first control adjustment signal Ctr.

The control adjustment signal Ctr maintains a logical high state during transition of the input signal In, even when the control signal Control and the input signal In transition to a logical high state at the same time so that there is almost no setup interval. Therefore, even though the control signal Control and the input signal In transition to a logical high state at the same time in the latch circuit 300 of the present invention, the metastability problem does not occur. A specific safety interval is caused to be created during the transition interval of the input signal In.

The latch block 310 is configured to output an original logical high state during a hold interval until the first control adjustment signal Ctr becomes a logical low state again, when the input signal In input to the second terminal transitions to a logical high state in a case that the control adjustment signal Ctr input to the first terminal is in a logical high state. The latch circuit 300 does not output a logical low signal until the first control adjustment signal Ctr becomes a logical low state, according to the first control adjustment signal Ctr.

Figure 6A:
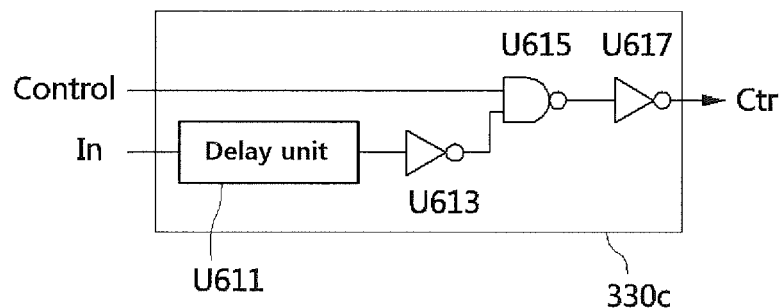
FIGS. 6A and 6B show a view illustrating another embodiment (for a NOR type latch block) of a control unit shown in FIG. 3.
Figure 6B:
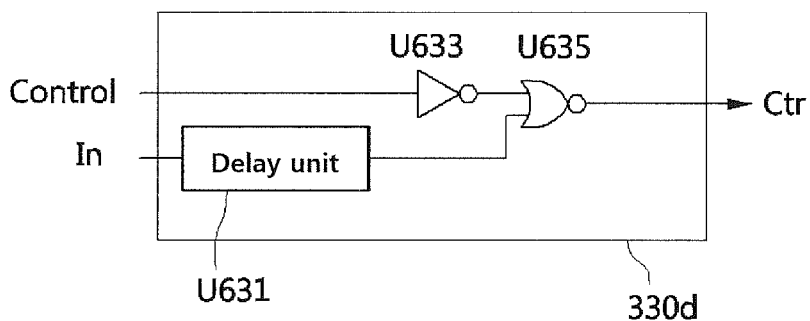

FIGS. 6A and 6B show examples of the control units 330c and 330d for the NOR type latch block. The control unit 330c of FIG. 6A includes a delay unit U611 for delaying the input signal In by a preset time and outputting the delayed signal, a first inverter U613 for inverting an output of the delay unit U611 and outputting the inverted signal, a NAND gate U615 for NAND-ing an output of the first inverter U613 and the control signal Control, and a second inverter U617 for inverting an output of the NAND gate U615 to output a second control adjustment signal Ctr.

FIG. 6B is based on the NOR gate, and has the same logical expression as in FIG. 6A. Therefore, the output of FIG. 6B is the same as that of the circuit of FIG. 6A. The control unit 330d of FIG. 6B includes a delay unit U631 for delaying the input signal In by a preset time and outputting the delayed signal, a third inverter U633 for inverting an output of the control signal Control and outputting the inverted signal, and a NOR gate U635 for NOR-ing an output of the third inverter U633 and an output of the delay unit U631 to output a second control adjustment signal Ctr.

Figure 7:
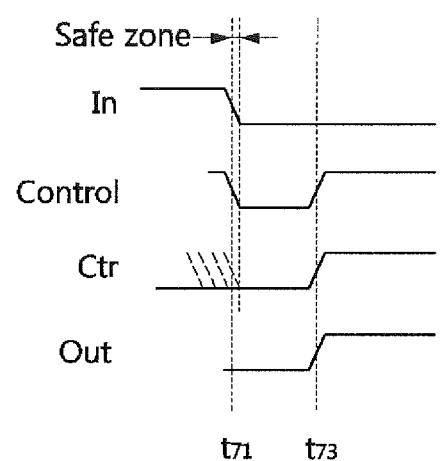
FIG. 7 is a diagram depicting an operation of the latch circuit to which the control unit of FIGS. 6A and 6B is applied.

FIG. 7 shows an operation of the latch circuit 300 to which the control units 330c and 330d of FIG. 6A or 6B are applied. The output of the control unit 330c shown in FIG. 6A is same as that of the control unit 330d as described above, and it will be described referring to FIG. 7 hereinafter on a basis of the latch circuit 300 to which the control unit 330c shown in FIG. 6A is applied.

Referring to FIG. 7, since the control signal Control and the input signal In transition to a logical low state at the same time, there is almost no setup interval. The first inverter U613 of the control unit 330c inverts the input signal In delayed by the delay unit U611 and outputs the inverted signal to the NAND gate U615. The NAND gate U615 and the second inverter U617 perform a logical AND operation on the control signal Control and the output of the first inverter U613 and output a second control adjustment signal Ctr.

Even when the control signal Control and the input signal In transition to a logical low state at the same time so that there is almost no setup interval, the second control adjustment signal Ctr has already been in a logical low state before the transition of the input signal In, and thus maintains a logical low state during the transition of the input signal In. Therefore, even though the control signal Control and the input signal In in the latch circuit 300 of the present invention transitions to a logical low state at the same time, the metastability problem does not occur. In the latch circuit 300 of the present invention, a specific safety interval is caused to be created during the transition of the input signal In.

The latch block 310 is configured to output an original logical low state during the hold interval in which the second control adjustment signal Ctr becomes a logical high state again, even though the input signal In input to the second terminal transitions to a logical low state in a case that the second control adjustment signal Ctr input to the first terminal is in a logical low state. When the second control adjustment signal Ctr is in a logical high state again, the latch circuit 300 outputs a signal of a logical high state according to the second control adjustment signal Ctr.

In the case of using the pass gate type latch block, the pass gate type latch block may be set to be operated either as a NAND type latch block or a NOR type latch block. When it is set to be operated as a NAND type latch block, a latch circuit including the control unit 330a or 330b of FIGS. 4A and 4B may be implemented. On the other hand, when it is set to be operated as a NOR type latch block, a latch circuit including the control unit 330c or 330d of FIGS. 6A and 6B may be implemented. The operation described with reference to FIG. 5 or FIG. 7 is applied as it is.

While the present invention has been particularly shown and described with reference to exemplary embodiments thereof, it is to be understood that the invention is not limited to the disclosed exemplary embodiments. On the contrary, it should be understood that various modifications may be made by those skilled in the art without departing from the spirit and scope of the present invention.

What is claimed is:

1. A latch circuit receiving an input signal (In) and a control signal (Control) and latching the input signal (In), the circuit comprising:
   a latch block including a first terminal and a second terminal receiving the input signal (In), and latching the input signal during a hold interval following a setup interval according to a change in logic values of the signals input to the first terminal and the second terminal; and
   a control unit receiving the input signal (In) and the control signal (Control), and outputting a control adjustment signal obtained by adjusting the control signal to the first terminal,
   wherein the control adjustment signal has a logical value of the hold interval during a transition interval of the input signal when the control signal and the input signal transition at the same time without the setup interval, thereby preventing an output failure of the latch block due to simultaneous transition of the control signal and the input signal,
   wherein, when the latch block is a NAND gate type, the control adjustment signal is obtained by delaying the input signal (In) by a preset time and then inverting the delayed input signal (In) when the control signal (Control) is in a logical low state.

2. The circuit according to claim 1, wherein the control unit includes:
   a delay unit delaying the input signal by the preset time to output the delayed signal;
   a first inverter inverting an output of the delay unit;
   a NOR gate NOR-ing an output of the first inverter and the control signal; and
   a second inverter inverting an output of the NOR gate to output the control adjustment signal.

3. The circuit according to claim 1, wherein the control unit includes:
- a delay unit delaying the input signal by the preset time to output the delayed signal;
- a third inverter inverting the control signal; and
- a NAND gate NAND-ing an output of the third inverter and an output of the delay unit.

4. A latch circuit receiving an input signal (In) and a control signal (Control) and latching the input signal (In), the circuit comprising:
- a latch block including a first terminal and a second terminal receiving the input signal (In), and latching the input signal during a hold interval following a setup interval according to a change in logic values of the signals input to the first terminal and the second terminal; and
- a control unit receiving the input signal (In) and the control signal (Control), and outputting a control adjustment signal obtained by adjusting the control signal to the first terminal,
- wherein the control adjustment signal has a logical value of the hold interval during a transition interval of the input signal when the control signal and the input signal transition at the same time without the setup interval, thereby preventing an output failure of the latch block due to simultaneous transition of the control signal and the input signal,
- wherein, when the latch block is a NOR gate type, the control adjustment signal is obtained by delaying the input signal (In) by a preset time and then inverting the delayed input signal (In) when the control signal (Control) is in a logical high state.

5. The circuit according to claim 4, wherein the control unit includes:
- a delay unit delaying the input signal by the preset time to output the delayed signal;
- a first inverter inverting an output of the delay unit;
- a NAND gate NAND-ing an output of the first inverter and the control signal; and
- a second inverter inverting an output of the NAND gate to output the control adjustment signal.

6. The circuit according to claim 4, wherein the control unit includes:
- a delay unit delaying the input signal by the preset time to output the delayed signal;
- a third inverter inverting the control signal; and
- a NOR gate NOR-ing an output of the third inverter and an output of the delay unit.

* * * * *